(12) United States Patent
Choi (10) Patent No.: US 12,300,546 B2
(45) Date of Patent: May 13, 2025

(54) WAFER DIVIDING METHOD

(71) Applicant: DISCO CORPORATION, Tokyo (JP)

(72) Inventor: Namsun Choi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 481 days.

(21) Appl. No.: 17/813,150

(22) Filed: Jul. 18, 2022

(65) Prior Publication Data

US 2023/0030317 A1  Feb. 2, 2023

(30) Foreign Application Priority Data

Aug. 2, 2021 (JP) .................................. 2021-126527

(51) Int. Cl.
*H01L 21/78* (2006.01)

(52) U.S. Cl.
CPC ..................................... *H01L 21/78* (2013.01)

(58) Field of Classification Search
None
See application file for complete search history.

(56) References Cited

U.S. PATENT DOCUMENTS

| 2015/0099346 A1 | 4/2015 | Yamashita et al. | |
| 2017/0213756 A1* | 7/2017 | Yoshida | H01L 21/78 |
| 2018/0342398 A1* | 11/2018 | Sekiya | B24B 9/065 |

FOREIGN PATENT DOCUMENTS

| DE | 102019208940 A1 | 12/2019 |
| DE | 102020204897 A1 | 10/2020 |
| JP | 53111586 A | 9/1978 |
| JP | 2007317935 A | 12/2007 |
| JP | 2009148982 A | 7/2009 |
| JP | 2015076434 A | 4/2015 |

OTHER PUBLICATIONS

Office Action issued in counterpart German patent application No. 10 2022 207 640.0, dated Aug. 14, 2024.
Office Action issued in counterpart Japanese patent application No. 2021-126527, dated Apr. 1, 2025.

* cited by examiner

Primary Examiner — Khaja Ahmad
(74) Attorney, Agent, or Firm — Greer Burns & Crain Ltd.

(57) ABSTRACT

A wafer dividing method of dividing a wafer along each of a plurality of projected dicing lines set in a grid pattern on a front surface of the wafer includes forming a division initiating point serving as an initiating point of division of the wafer along each of the dicing lines, adhering a protective film made of an olefin-based resin and having one surface with no adhesive used therein to the wafer in such a manner that the one surface is brought into intimate contact with the front surface of the wafer, supporting the wafer by a support table in such a manner that the front surface of the wafer and the support table face each other, and applying an external force to the wafer from a back surface side of the wafer to thereby divide the wafer at the division initiating points.

3 Claims, 6 Drawing Sheets

WAFER DIVIDING METHOD

BACKGROUND OF THE INVENTION

Field of the Invention

The present invention relates to a wafer dividing method of dividing a wafer having a front surface on which a plurality of projected dicing lines are set in a grid pattern, along the projected dicing lines.

Description of the Related Art

As a method of dividing such a wafer as a sapphire wafer or a silicon wafer into individual chips, there is known a technology for carrying out a scribing step and a breaking step on the wafer (see Japanese Patent Laid-open No. 2009-148982, for example). Specifically, first, one surface of the wafer is scribed using a scriber (also called a scribing tool) such as a diamond-tipped scriber along a plurality of projected dicing lines set on the one surface of the wafer (scribing step).

The wafer is then supported by a support base of a breaking apparatus in such a manner that the support base and the one surface of the wafer face each other. Thereafter, a blade of the breaking apparatus is pressed against the other surface of the wafer, thereby applying an external force to the wafer. Pressing the blade against the other surface of the wafer along each of the projected dicing lines divides the wafer along the projected dicing lines into a plurality of chips (breaking step). It is to be noted that, on the one surface (front surface) of the wafer, devices such as light emitting diodes (LEDs) or integrated circuits (ICs) may be formed in respective regions demarcated by the plurality of projected dicing lines set in a grid pattern.

In the breaking step, the wafer is placed on the support base in such a manner that the front surface of the wafer faces downward. Therefore, for the purpose of reducing damages to the devices in the breaking step, one possible way is to cover the front surface of the wafer with a protective film made of resin after the scribing step but before the breaking step. In the subsequent breaking step, the front surface of the wafer is made to face the support base with the protective film interposed therebetween. The breaking step sometimes causes friction between the front surface of the wafer and the protective film, which leads to adhesion of debris in the form of fine powder to the front surface of the wafer. In the case of using a protective film made of polyethylene terephthalate, for example, the friction between the wafer and the protective film causes debris of the resin forming the protective film to adhere to the front surface of the wafer.

SUMMARY OF THE INVENTION

The present invention has been made in view of the problem described above, and it is therefore an object of the present invention to reduce an amount of debris which is derived from the protective film and which adheres to the front surface of the wafer when the wafer is divided.

In accordance with an aspect of the present invention, there is provided a wafer dividing method of dividing a wafer having a front surface on which a plurality of projected dicing lines are set in a grid pattern and devices are formed in respective regions demarcated by the plurality of projected dicing lines, along each of the projected dicing lines. The wafer dividing method includes a division initiating point forming step of forming a division initiating point along each of the projected dicing lines, the division initiating point having a mechanical strength lower than that in the regions where the devices are formed and serving as an initiating point of division of the wafer, a protective film adhering step of, after the division initiating point forming step, adhering a protective film made of an olefin-based resin and having one surface with no adhesive used therein to the wafer in such a manner that the one surface is brought into intimate contact with the front surface of the wafer, a supporting step of, after the protective film adhering step, supporting the wafer by a support table in such a manner that the front surface of the wafer and the support table face each other, and a dividing step of, after the supporting step, applying an external force to the wafer from a back surface side of the wafer, to thereby divide the wafer at the division initiating points.

Preferably, in the supporting step, the wafer is supported by the support table having elasticity.

Further preferably, in the division initiating point forming step, the wafer is applied with a pulsed laser beam having a wavelength transmittable through the wafer with a focused spot of the laser beam positioned inside the wafer while the focused spot of the laser beam and the wafer are moved relative to each other along each of the projected dicing lines, to thereby form a modified layer functioning as the division initiating point along each of the projected dicing lines.

In the wafer dividing method according to one aspect of the present invention, after the division initiating point forming step, a protective film made of an olefin-based resin and having one surface with no adhesive used therein is caused to adhere to the wafer in such a manner that the one surface is brought into intimate contact with the front surface of the wafer (protective film adhering step). After the protective film adhering step, the supporting step is carried out, and then, the dividing step is carried out. The dividing step is carried out in the state in which the protective film and the front surface of the wafer are in intimate contact with each other. Therefore, friction between the protective film and the wafer can be reduced. Moreover, since the protective film is made of an olefin-based resin, even if some friction occurs between the protective film and the wafer, it is possible to reduce the amount of debris which is derived from the protective film and which adheres to the front surface of the wafer compared to the case of using a protective film made of polyethylene terephthalate which is relatively brittle.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
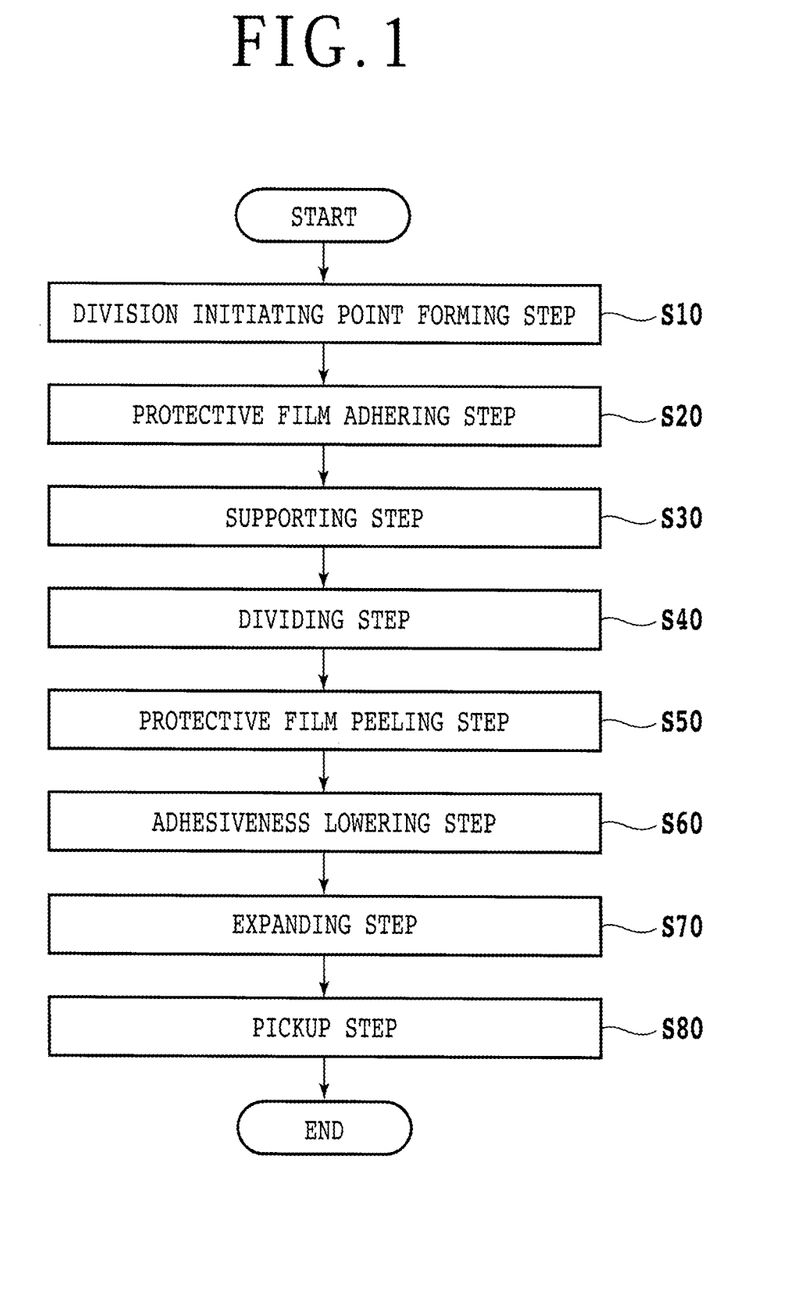
FIG. 1 is a flowchart for explaining a wafer dividing method.
Figure 2:
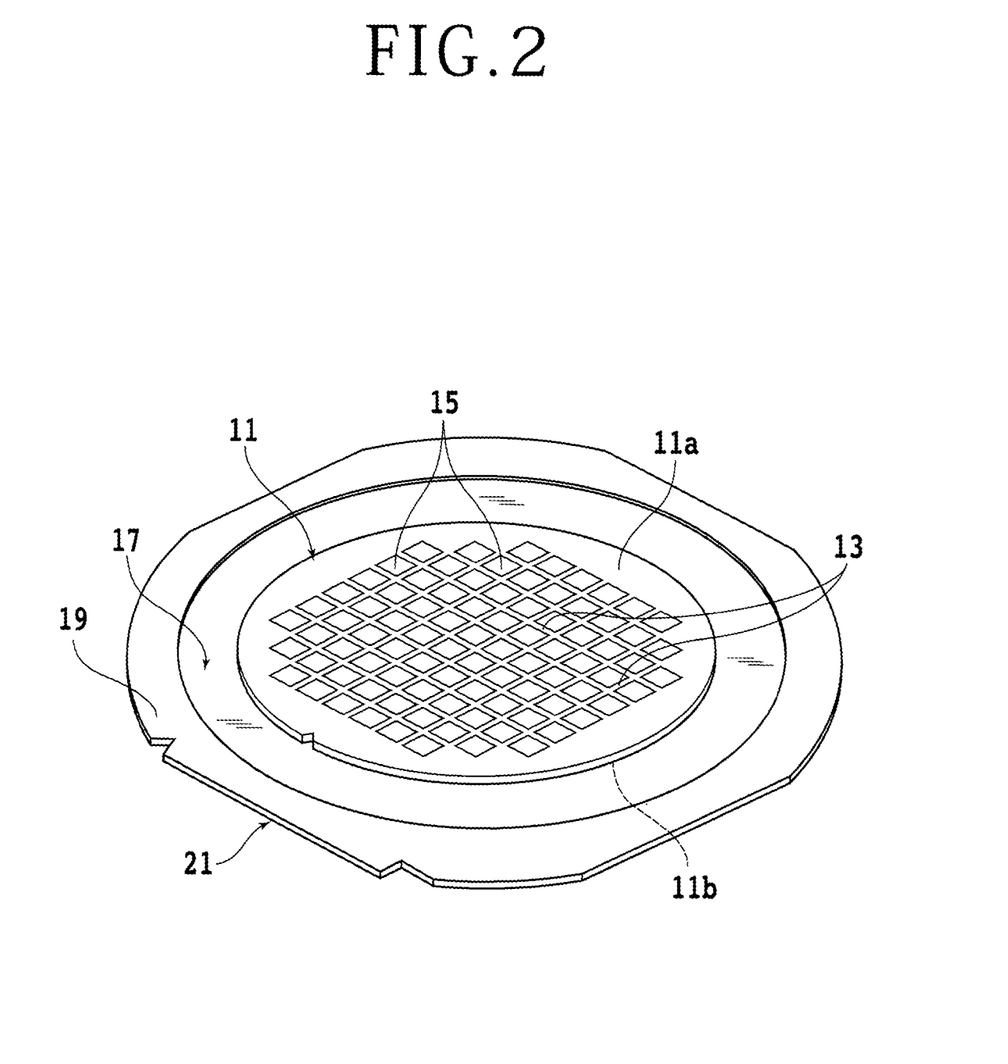
FIG. 2 is a perspective view of a wafer unit.

A preferred embodiment of the present invention will be described in detail hereinbelow with reference to the accompanying drawings. FIG. 1 is a flowchart for explaining a method of dividing a wafer 11 (refer to FIG. 2). Description will be made first of the wafer 11 in a disk shape to be divided. FIG. 2 is a perspective view of a wafer unit 21 including the wafer 11. The wafer 11 is mainly made of silicon, for example, and has a front surface 11a and a back surface 11b both in a substantially circular shape. The wafer 11 has, for example, a thickness (i.e., a distance from the front surface 11a to the back surface 11b) of 75 μm and a diameter of approximately 200 mm (eight inches). On the front surface 11a, a plurality of projected dicing lines 13 are set in an orthogonally intersecting manner (i.e., in a grid pattern).

In respective regions demarcated by the plurality of projected dicing lines 13, devices 15 such as ICs and large scale integration (LSI) circuits are formed, and the front surface 11a thus has minute irregularities attributable to configurations, shapes, and the like of the devices 15. It is to be noted that the material of the wafer 11 is not limited to silicon, and the wafer 11 may be made of another compound semiconductor, sapphire, or glass. Further, the wafer 11 is not limited in shape, configuration, size, and the like, and the devices 15 are not specifically limited in type, quantity, shape, configuration, size, layout, and the like.

When the wafer 11 is to be divided, a wafer unit 21 in which the wafer 11 is supported to a metallic annular frame 19 through a dicing tape 17 made of resin is formed. The dicing tape 17 is a circular tape having a diameter larger than that of the wafer 11. The dicing tape 17 has a laminated structure including a base material layer and an adhesive layer (paste layer), for example. On the entire surface of one side of the base material layer, the adhesive layer made of resin having adhesiveness such as an ultraviolet (UV) curable resin or a thermosetting resin is formed. The wafer 11 is pasted to a substantially central portion of the dicing tape 17, and one surface of the annular frame 19 is pasted to an outer circumferential portion of the dicing tape 17. After the wafer unit 21 is formed in this manner, division initiating points are formed in the wafer 11 by using a laser processing apparatus 2 (division initiating point forming step S10).

Figure 3:
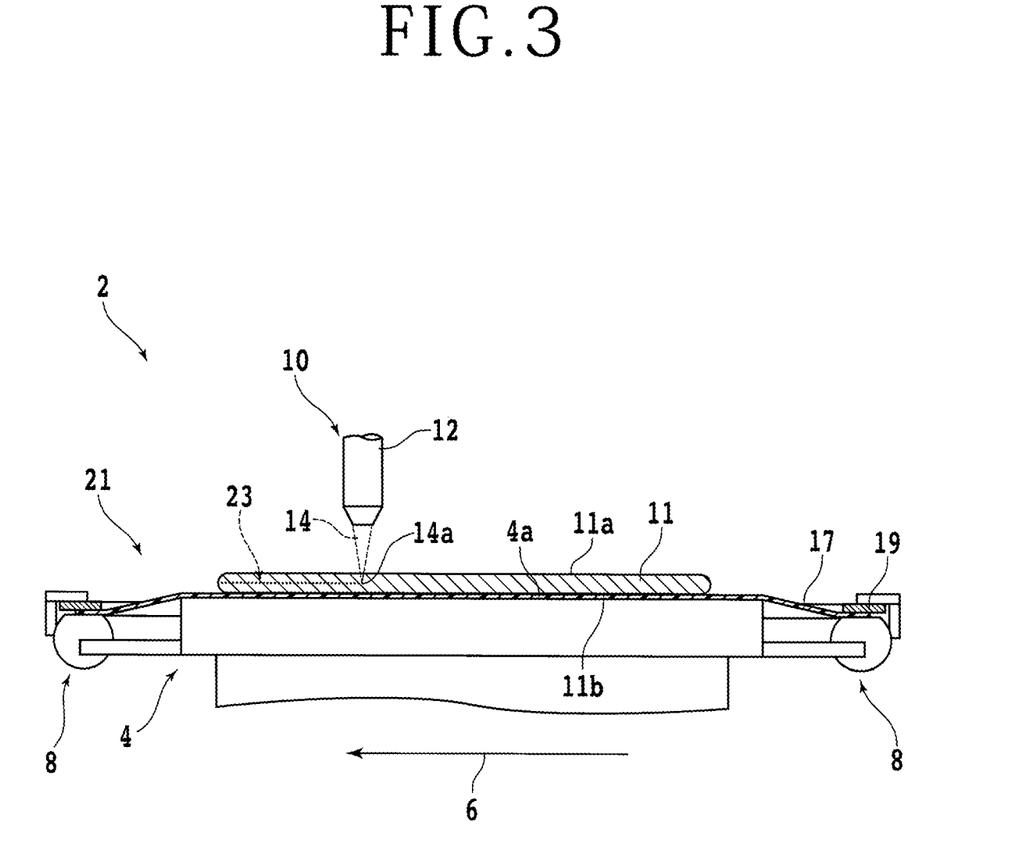
FIG. 3 is a diagram for explaining a division initiating point forming step.

Description will be made next of the laser processing apparatus 2 to be used in the division initiating point forming step S10 with reference to FIG. 3. The laser processing apparatus 2 includes a disk-shaped chuck table 4 having a substantially flat holding surface 4a. The holding surface 4a receives negative pressure generated by and transmitted from a suction source (not illustrated) such as an ejector. The chuck table 4 is connected at a lower portion thereof to a rotational drive source (not illustrated) and is rotatable about a predetermined axis of rotation. Below the rotational drive source, there is provided a processing-feed mechanism (not illustrated) of a ball-screw type. The processing-feed mechanism moves the chuck table 4 and the rotational drive source in a processing-feed direction 6.

Below the processing-feed mechanism, there is provided an indexing-feed mechanism (not illustrated) of a ball-screw type. The indexing-feed mechanism moves the processing-feed mechanism, the chuck table 4, and the rotational drive source in an integrated manner in an indexing-feed direction that orthogonally intersects the processing-feed direction 6 within a horizontal plane. On lateral sides of the chuck table 4, a plurality of clamp mechanisms 8 are arranged along a circumferential direction of the chuck table 4. The clamp mechanisms 8 each clamp the annular frame 19 when the holding surface 4a holds the wafer 11 under suction through the dicing tape 17.

Above the holding surface 4a, there is provided a head portion 12 of a laser beam applying unit 10. The head portion 12 includes a focusing lens (not illustrated), and a pulsed laser beam emitted from a laser oscillator (not illustrated) of the laser beam applying unit 10 is applied from the head portion 12 toward the holding surface 4a. This pulsed laser beam, denoted by 14, has a wavelength transmittable through the wafer 11. It is to be noted that, near the head portion 12, a microscope camera unit (not illustrated) having a predetermined optical system and a predetermined image sensor (e.g., a solid-state image sensor) is provided to capture an image of the front surface 11a.

Described next is the division initiating point forming step S10. FIG. 3 is a diagram for explaining the division initiating point forming step S10. In the division initiating point forming step S10, first, the back surface 11b of the wafer 11 is held under suction by the holding surface 4a through the dicing tape 17, and the clamp mechanisms 8 each clamp the annular frame 19. The microscope camera unit then captures an image of two separate positions on one projected dicing line 13 on the front surface 11a, which is exposed upward, to carry out alignment. According to results of the alignment, the rotational drive source is actuated to set the one projected dicing line 13 and the processing-feed direction 6 substantially parallel to each other.

The chuck table 4 is then moved in the processing-feed direction 6 relative to a focused spot 14a of the laser beam 14 in such a manner that the focused spot 14a moves along the one projected dicing line 13 while being positioned inside the wafer 11 at a predetermined depth. With the focused spot 14a and the wafer 11 moved relative to each other along the one projected dicing line 13 in this manner, a modified layer (division initiating point) 23 is formed inside the wafer 11, the modified layer 23 having a mechanical strength lower than that in the regions where the devices 15 are formed and serving as an initiating point of division of the wafer 11. In the division initiating point forming step S10, for example, processing conditions are set as follows:

Laser beam wavelength: 1064 nm
Average output: 0.3 W
Pulse repetition frequency: 80 kHz
Processing-feed speed: 300 mm/s
Number of passes: 2

It is to be noted that the number of passes means the number of times of application of the laser beam 14 carried out along one projected dicing line 13. For example, for a first application (i.e., a first pass), the application of the laser beam 14 is carried out along one projected dicing line 13 with the focused spot 14a positioned at a depth of approximately 50 μm from the front surface 11a, to form a modified layer 23.

Subsequently, for a second application (i.e., a second pass), the application is carried out along the same projected dicing line 13 with the focused spot 14a positioned at a depth of approximately 25 μm from the front surface 11a to form another modified layer 23. In this manner, a modified layer 23 is formed at each of different depths inside the wafer 11 along one projected dicing line 13. After the modified layers 23, the number of which corresponds to the number of passes, are formed along the one projected dicing line 13, the chuck table 4 is indexing-fed by a predetermined length in the indexing-feed direction. Similar processing is carried out to form modified layers 23 along another projected dicing line 13 adjacent to the one projected dicing line 13.

After modified layers 23 are formed along all the projected dicing lines 13 extending in one direction, the chuck table 4 is rotated by 90 degrees, and similar processing is carried out to form modified layers 23 along all the projected dicing lines 13 extending in another direction orthogonally intersecting the one direction. It is to be noted that, although, attendant on the formation of the modified layers 23, cracks (not illustrated) are formed to extend from the modified layers 23 toward the front surface 11a and the back surface 11b, the cracks at this point do not reach the front surface 11a and the back surface 11b.

Figure 4:
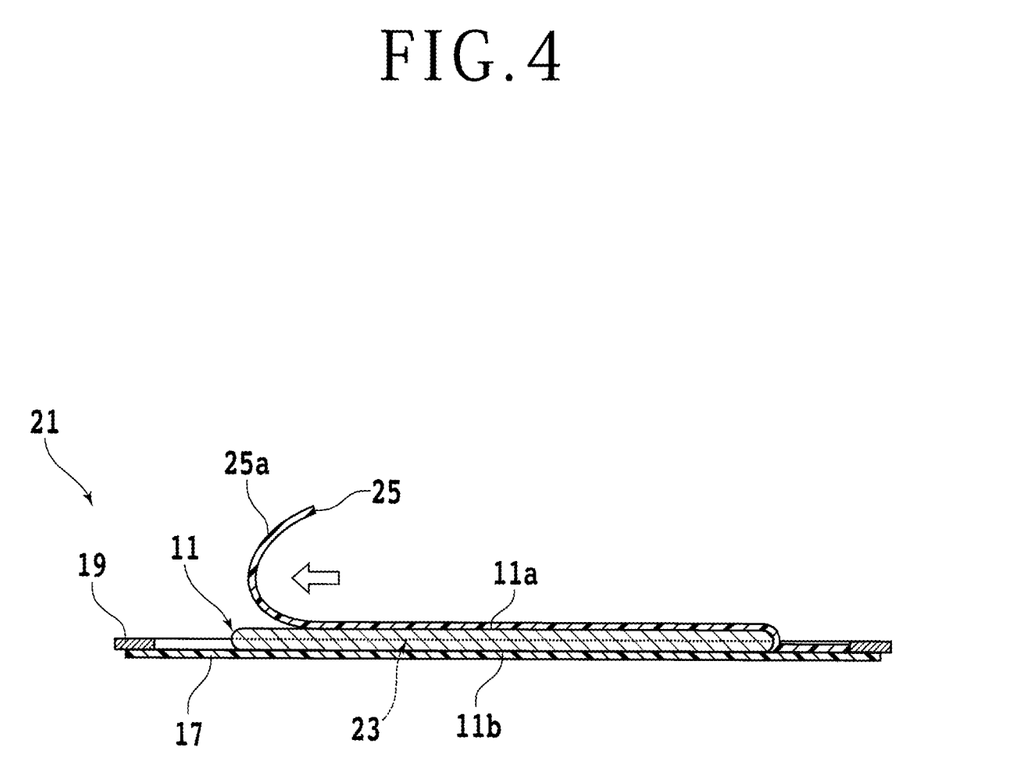
FIG. 4 is a diagram for explaining a protective film adhering step.

After the division initiating point forming step S10, a circular protective film 25 having one surface 25a with no adhesive used therein is caused to adhere to the front surface 11a of the wafer 11 in such a manner that the one surface 25a is brought into intimate contact with the front surface 11a (protective film adhering step S20). FIG. 4 is a diagram for explaining the protective film adhering step S20. The protective film 25 is made of an olefin-based resin in the present embodiment. The olefin-based resin includes polyolefin such as polyethylene (PE) or polypropylene (PP), each of which is a high molecular compound synthesized using alkene as a monomer, and also includes a copolymer of an alkene monomer and another kind of monomer such as an ethylene-vinyl acetate copolymer. The protective film 25 made of the olefin-based resin generally (compared to a protective film made of polyethylene terephthalate, for example) has as its mechanical characteristics a relatively high rate of elongation and relatively high flexibility.

When the protective film 25 is pressed against the front surface 11a of the wafer 11, an electrostatic force, an intermolecular force, reduced-pressure suction, or the like acts to bring the one surface 25a of the protective film 25 into intimate contact with the front surface 11a although the one surface 25a has no adhesive layer. It is to be noted that the present embodiment offers an advantageous effect that, by use of no adhesive to form an adhesive layer on the one surface 25a of the protective film 25, no adhesive is left on the front surface 11a of the wafer 11 after the protective film 25 is peeled off from the wafer 11.

In the protective film adhering step S20, a protective film 25 of a predetermined size is cut out from a film roll (not illustrated) obtained by winding the protective film 25 in a roll shape, and the cut-out protective film 25 is pressed against the front surface 11a. For example, after an operator places the protective film 25 of the predetermined size on the front surface 11a, a disk-shaped pressing body (not illustrated) larger in diameter than the wafer 11 is heated to a predetermined temperature, and the heated pressing body is pressed against the protective film 25. It is to be noted that similar processing may be carried out automatically by a predetermined apparatus (not illustrated).

The protective film 25 has a circular shape, for example, and a diameter larger than that of the wafer 11. When the protective film 25 larger in diameter than the wafer 11 is brought into intimate contact with the wafer 11, an annular region on the one surface 25a of the protective film 25 which region is positioned outward with respect to the wafer 11 in its radial direction adheres to the adhesive layer of the dicing tape 17. If the protective film 25 is smaller in diameter than the wafer 11, the protective film 25 would adhere to a support table 24 (refer to FIG. 5) to be used in a subsequent step, leading to the possibility that the protective film 25 may unintentionally be peeled off from the front surface 11a. In contrast, since the protective film 25 is larger in diameter than the wafer 11 in the present embodiment, such unintentional peel-off of the protective film 25 from the front surface 11a and unintentional adhesion of the protective film 25 to the support table 24 can be prevented.

It is to be noted that the diameter of the protective film 25 may be larger than an inner diameter of the annular frame 19. In this case, part of the protective film 25 is brought into intimate contact with the annular frame 19. This enables setting of a peel-off starting point in the region of intimate contact between the protective film 25 and the annular frame 19 which point is to be used when the protective film 25 is peeled off in a subsequent step. Since no adhesive layer is provided on the annular frame 19, it is easier to peel off the protective film 25 because of the peel-off starting point set in the region of intimate contact between the protective film 25 and the annular frame 19 than in a case in which a peel-off starting point is set in a region where the protective film 25 and the dicing tape 17 are bonded to each other.

Figure 5:
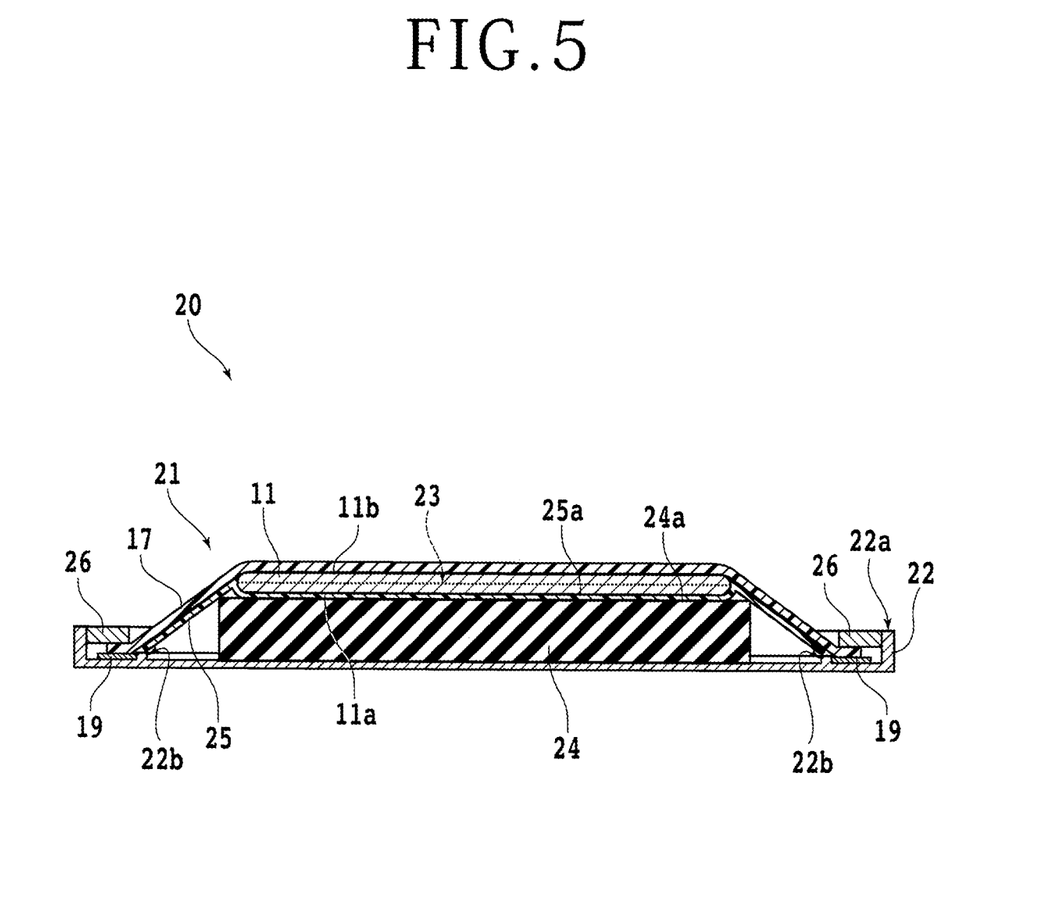
FIG. 5 is a diagram for explaining a supporting step.

After the protective film adhering step S20, the wafer unit 21 is delivered to a breaking apparatus 20 (refer to FIG. 5) for dividing the wafer 11 with the modified layers 23 used as the division initiating points. As illustrated in FIG. 5, the breaking apparatus 20 has a frame body 22 in a relatively shallow, bottomed cylindrical shape. At a central portion in the frame body 22, there is disposed the support table 24 formed in a disk shape, made of rubber, and having elasticity. A diameter of the support table 24 is larger than that of the wafer 11 but smaller than the inner diameter of the annular frame 19. Further, the support table 24 has an upper surface 24a of the support table 24 positioned higher than an upper surface 22a of the frame body 22.

A protrusion 22b for preventing positional deviation of the annular frame 19 in a horizontal direction is provided on a portion of an inner bottom surface of the frame body 22, the portion being located outward with respect to the support table 24. The protrusion 22b is formed, for example, in an annular shape along a circumferential direction of the frame body 22. After the annular frame 19 is disposed in such a manner that its inner side makes contact with an outer side of the protrusion 22b, an annular pressing member 26 having an outer diameter substantially the same as an inner diameter of the frame body 22 is disposed above the annular frame 19. The annular frame 19 is clamped by the pressing member 26 and the inner bottom surface of the frame body 22. It is to be noted that, although, when the annular frame 19 is clamped by the pressing member 26 and the frame body 22, some tensile stress acts on the dicing tape 17 in a direction expanding radially, this tensile stress alone is not sufficient to divide the wafer 11.

Above the support table 24, there is provided a cylindrical roller 28 (refer to FIG. 6) made of stainless steel. A length of the roller 28 in its longitudinal direction is, for example, equal to or larger than the diameter of the wafer 11 but equal to or smaller than the inner diameter of the annular frame 19. The roller 28 is movable in a rolling manner in a predetermined direction within a horizontal plane. Further, the moving direction of the roller 28 can be rotated by 90 degrees relative to the frame body 22 within the horizontal plane.

A height of a lower end of the roller 28 is fixed at a predetermined position above the support table 24 while the roller 28 is being moved in a rolling manner. It is to be noted that the height of the lower end of the roller 28 can be adjusted as needed. By adjusting the height of the lower end of the roller 28 with respect to the upper surface 24a, it is possible to adjust an amount of pressing of the roller 28 against the wafer 11. The wafer 11 having been subjected to the protective film adhering step S20 is supported by the support table 24 in such a manner that the front surface 11a and the upper surface 24*a* face each other (supporting step S30). FIG. 5 is a diagram for explaining the supporting step S30.

In the supporting step S30, the annular frame 19 is fixed in horizontal position by the protrusion 22*b* and fixed in vertical position by the pressing member 26 and the frame body 22. After the supporting step S30, the roller 28 is moved in a rolling manner with respect to the upper surface 24*a*, so that an external force is applied to the wafer 11 from the back surface 11*b* side. Accordingly, the wafer 11 is divided into a plurality of chips (not illustrated) (dividing step S40).

Figure 6:
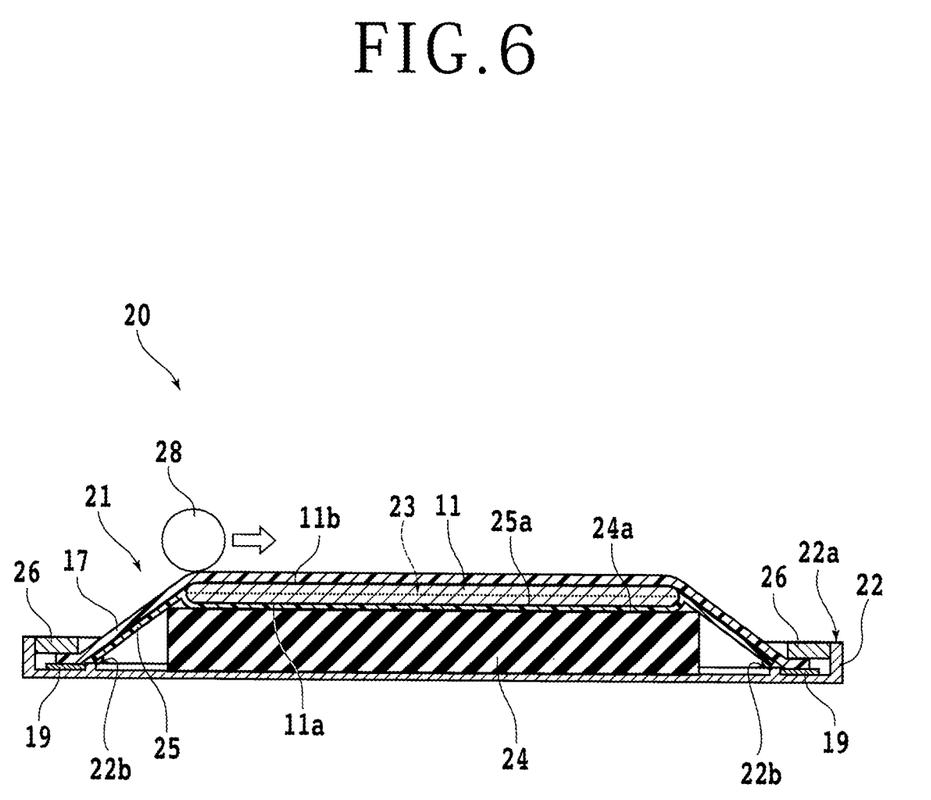
FIG. 6 is a diagram for explaining a dividing step.

FIG. 6 is a diagram for explaining the dividing step S40. In the dividing step S40, first, the roller 28 is moved in a rolling manner with its moving direction set in parallel with the projected dicing lines 13 extending in the one direction. This applies an external force to each of the projected dicing lines 13 extending in the one direction in a substantially uniform manner, so that cracks successively extend from the respective modified layers 23 toward the front surface 11*a* and the back surface 11*b* over the entire projected dicing lines 13 extending in the one direction from one end to the other end thereof.

The moving direction of the roller 28 is then rotated by 90 degrees within the horizontal plane relative to the frame body 22, so that the moving direction is set substantially parallel to the projected dicing lines 13 extending in the other direction orthogonally intersecting the one direction. The roller 28 is moved in a rolling manner in this state. This applies an external force to each of the projected dicing lines 13 extending in the other direction in a substantially uniform manner. With such external forces applied, cracks successively extend from the respective modified layers 23 toward the front surface 11*a* and the back surface 11*b* over the entire projected dicing lines 13 extending in the other direction from one ends to the other ends thereof. The cracks formed along the respective projected dicing lines 13 thus reach the front surface 11*a* and the back surface 11*b*, and accordingly, the wafer 11 is divided into a plurality of chips.

Since the dividing step S40 in the present embodiment is carried out in the state in which the one surface 25*a* of the protective film 25 and the front surface 11*a* of the wafer 11 are in intimate contact with each other, friction between the protective film 25 and the wafer 11 can be reduced. In addition, since the protective film 25 is made of an olefin-based resin, even if some friction occurs between the protective film 25 and the wafer 11, it is possible to reduce the amount of debris which is derived from the protective film 25 and which adheres to the front surface 11*a* of the wafer 11, compared to the case of using a protective film made of polyethylene terephthalate which is relatively brittle. After the dividing step S40, the wafer unit 21 is unloaded from the breaking apparatus 20, and the protective film 25 is peeled off from the wafer 11 (protective film peeling step S50). The peel-off of the protective film 25 may manually be carried out by an operator or may automatically be carried out by a peeling apparatus (not illustrated).

After the protective film peeling step S50, the adhesiveness of the dicing tape 17 is lowered (adhesiveness lowering step S60). For example, in the case of using a UV curable resin as the adhesive layer of the dicing tape 17, UV rays are applied to the dicing tape 17. Alternatively, in the case of using a thermosetting resin as the adhesive layer, the adhesiveness is lowered by heating the dicing tape 17 to a predetermined temperature. After the adhesiveness lowering step S60, the dicing tape 17 is expanded with use of an expanding apparatus (not illustrated) to enlarge gaps between the chips (expanding step S70). Thereafter, each of the chips is picked up with use of a collet or the like (pickup step S80).

The configurations and methods relating to the embodiment described above can be implemented in a modified manner as appropriate without departing from the scope of the object of the present invention. For example, in the division initiating point forming step S10, instead of the formation of the modified layers 23, the front surface 11*a* may be scribed along each of the projected dicing lines 13 with use of a scriber such as a diamond-tipped scriber to thereby form division initiating points on the front surface 11*a*.

It is to be noted that, in the case of using a protective film 25 having a relatively large thickness (50 μm or more, for example), the entire support table 24 need not necessarily be made of rubber. For example, the support table 24 may partially be made of metal such as stainless steel. However, even in the case of using the support table 24 partially made of metal, it is preferable that a circular elastic layer made of rubber be disposed at an uppermost portion of the support table 24 for the purpose of more certainly preventing the devices 15 from being damaged.

Moreover, in the dividing step S40, instead of using the roller 28, a linear blade or breaking bar may successively be pressed against the back surface 11*b* side along the positions corresponding to the projected dicing lines 13, to thereby apply external forces to the wafer 11.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A wafer dividing method of dividing a wafer having a front surface on which a plurality of projected dicing lines are set in a grid pattern and devices are formed in respective regions demarcated by the plurality of projected dicing lines, along each of the projected dicing lines, the wafer dividing method comprising:

a division initiating point forming step of forming a division initiating point along each of the projected dicing lines, the division initiating point having a mechanical strength lower than that in the regions where the devices are formed and serving as an initiating point of division of the wafer;

a protective film adhering step of, after the division initiating point forming step, adhering a protective film made of an olefin-based resin and having one surface with no adhesive used therein to the wafer in such a manner that the one surface is brought into intimate contact with the front surface of the wafer;

a supporting step of, after the protective film adhering step, supporting the wafer by a support table in such a manner that the front surface of the wafer and the support table face each other; and a dividing step of, after the supporting step, applying an external force to the wafer from a back surface side of the wafer, to thereby divide the wafer at the division initiating points.

2. The wafer dividing method according to claim 1, wherein, in the supporting step, the wafer is supported by the support table having elasticity.

3. The wafer dividing method according to claim 1, wherein, in the division initiating point forming step, the wafer is applied with a pulsed laser beam having a wavelength transmittable through the wafer with a focused spot of the laser beam positioned inside the wafer while the focused spot of the laser beam and the wafer are moved relative to each other along each of the projected dicing lines, to thereby form a modified layer functioning as the division initiating point along each of the projected dicing lines.

* * * * *